(12) United States Patent
Kumura et al.

(10) Patent No.: US 7,400,005 B2
(45) Date of Patent: Jul. 15, 2008

(54) SEMICONDUCTOR MEMORY DEVICE HAVING FERROELECTRIC CAPACITORS WITH HYDROGEN BARRIERS

(75) Inventors: Yoshinori Kumura, Yokohama (JP); Iwao Kunishima, Yokohama (JP); Hiroyuki Kanaya, Yokohama (JP); Tohru Ozaki, Tokyo (JP); Kazuhiro Tomioka, Tsukuba (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 393 days.

(21) Appl. No.: 11/142,441

(22) Filed: Jun. 2, 2005

(65) Prior Publication Data

US 2006/0180894 A1    Aug. 17, 2006

(30) Foreign Application Priority Data

Feb. 14, 2005    (JP)    ............... 2005-036601

(51) Int. Cl.
*H01L 29/92*    (2006.01)
(52) U.S. Cl. .............. 257/295; 257/532; 257/636; 257/E21.663; 257/E21.664; 438/3
(58) Field of Classification Search ............ 438/3; 257/E21.663, E21.664, 636, 532, 295
See application file for complete search history.

(56) References Cited

U.S. PATENT DOCUMENTS 6,982,444 B2 * 1/2006 Kanaya et al. ............. 257/295

7,001,821 B2 * 2/2006 Aggarwal et al. ........... 438/396
2002/0006674 A1 * 1/2002 Ma et al. .................... 438/3
2005/0012126 A1 * 1/2005 Udayakumar et al. ....... 257/295

FOREIGN PATENT DOCUMENTS

JP    2003-51582    2/2003
JP    2003-68987    3/2003

OTHER PUBLICATIONS

U.S. Appl. No. 11/142,441, filed Jun. 2, 2005, Kumura et al.
U.S. Appl. No. 11/288,204, filed Nov. 29, 2005, Kumura et al.
U.S. Appl. No. 11/276,781, filed Mar. 14, 2006, Kanaya.

* cited by examiner

*Primary Examiner*—Jerome Jackson
*Assistant Examiner*—Paul A Budd
(74) *Attorney, Agent, or Firm*—Oblon, Spivak, McClelland, Maier & Neustadt, P.C.

(57) ABSTRACT

A semiconductor memory device, which prevents the penetration of hydrogen or moisture to a ferroelectric capacitor from its surrounding area including a contact plug portion, comprises a ferroelectric capacitor formed above a semiconductor substrate, a first hydrogen barrier film formed on an upper surface of the ferroelectric capacitor to work as a mask in the formation of the ferroelectric capacitor, a second hydrogen barrier film formed on the upper surface and a side face of the ferroelectric capacitor including on the first hydrogen barrier film, and a contact plug disposed through the first and second hydrogen barrier films, and connected to an upper electrode of the ferroelectric capacitor, a side face thereof being surrounded with the hydrogen barrier films.

12 Claims, 11 Drawing Sheets

SEMICONDUCTOR MEMORY DEVICE HAVING FERROELECTRIC CAPACITORS WITH HYDROGEN BARRIERS

CROSS-REFERENCE TO RELATED APPLICATIONS

This application is based upon and claims the benefit of priority from prior Japanese Patent Application No. 2005-036601, filed Feb. 14, 2005, the entire contents of which are incorporated herein by reference.

BACKGROUND OF THE INVENTION

1. Field of the Invention

The present invention relates to a semiconductor device and its manufacturing method, and more particularly to a semiconductor device which uses a ferroelectric film and its manufacturing method.

2. Description of the Related Art

In a semiconductor device such as a ferroelectric random access memory (FeRAM) which uses a ferroelectric capacitor using a ferroelectric film, if hydrogen or moisture penetrates the capacitor during the manufacturing process after the ferroelectric capacitor is formed, the characteristics of the ferroelectric capacitor, especially the polarization characteristics of the ferroelectric film, are degraded. To prevent this degradation, the capacitor is covered with a hydrogen diffusion preventive film, e.g., an aluminum oxide ($Al_2O_3$) film, to prevent the penetration of hydrogen. The $Al_2O_3$ film is preferably formed in an atmosphere which does not contain hydrogen, thus sputtering is used for the formation typically. However, miniaturization of the semiconductor device has increased the ratio of the height of the ferroelectric capacitor to space (aspect ratio). Because of the need to cover the ferroelectric capacitor with the large aspect ratio, sputtering which is poor in step coverage cannot be used as it is. According to a method disclosed in Jpn. Pat. Appln. KOKAI Publication No. 2003-68987, to improve the step coverage, a ferroelectric capacitor is covered with an interlevel insulator to reduce the step of the capacitor, then $Al_2O_3$ film is formed thereon by sputtering. As another technology, Jpn. Pat. Appln. KOKAI Publication No. 2003-51582 discloses a method of using a hard mask which has the hydrogen barrier characteristics in an etching process of a ferroelectric capacitor. According to the method, $Al_2O_3$ film that is a hydrogen barrier film is deposited by sputtering after the ferroelectric capacitor is formed. Therefore, coverage of a ferroelectric capacitor side face with the hydrogen barrier film is not really sufficient. Additionally, a method of forming an $Al_2O_3$ film by atomic layer deposition (ALD) having excellent step coverage has been put to practical use. However, ALD is not suitable to form a thick $Al_2O_3$ film because its deposition speed is slow.

In all of the aforementioned technologies, an interlevel insulator is formed on the hydrogen barrier film which covers the ferroelectric capacitor, i.e., $Al_2O_3$ film, and a contact plug is formed in these films being connected to an upper electrode of the ferroelectric capacitor. The contact plug is formed by partially removing the hydrogen barrier film. The contact plug itself is not a hydrogen barrier material, a part of its surrounding area is contacted to the interlevel insulator, and thus the contact plug is not entirely covered with the hydrogen barrier film. Accordingly, there is a possibility that hydrogen will penetrate the ferroelectric capacitor through the contact plug portion to degrade the characteristics of the ferroelectric capacitor.

Therefore, there is need for a semiconductor memory device which prevents the penetration of hydrogen or moisture to a ferroelectric capacitor from its surrounding area including a contact plug portion, and its manufacturing method.

BRIEF SUMMARY OF THE INVENTION

According to an aspect of the present invention, a semiconductor memory device, comprises: a ferroelectric capacitor formed above a semiconductor substrate; a first hydrogen barrier film formed on an upper surface of the ferroelectric capacitor to work as a mask in the formation of the ferroelectric capacitor; a second hydrogen barrier film formed on the upper surface and a side face of the ferroelectric capacitor including on the first hydrogen barrier film; and a contact plug disposed through the first and second hydrogen barrier films, and connected to an upper electrode of the ferroelectric capacitor, a side face thereof being surrounded with the hydrogen barrier films.

According to another aspect of the present invention, a method of manufacturing a semiconductor memory device, comprises: sequentially depositing a lower electrode material film, a ferroelectric film, and an upper electrode material film for a ferroelectric capacitor above a semiconductor substrate; depositing a first hydrogen barrier film on the upper electrode material film; processing the first hydrogen barrier film into a pattern of the ferroelectric capacitor; forming the ferroelectric capacitor by sequentially processing the upper electrode material film, the ferroelectric film and the lower electrode material film for the ferroelectric capacitor by using the first hydrogen barrier film processed into the pattern as a mask; forming a second hydrogen barrier film on the upper surface and a side face of the ferroelectric capacitor including on the first hydrogen barrier film; forming a contact hole through the first and second hydrogen barrier films to reach an upper electrode of the ferroelectric capacitor; and forming a contact plug which fills the contact hole and a side face of which is surrounded with the hydrogen barrier films.

DETAILED DESCRIPTION OF THE INVENTION

Figure 1:
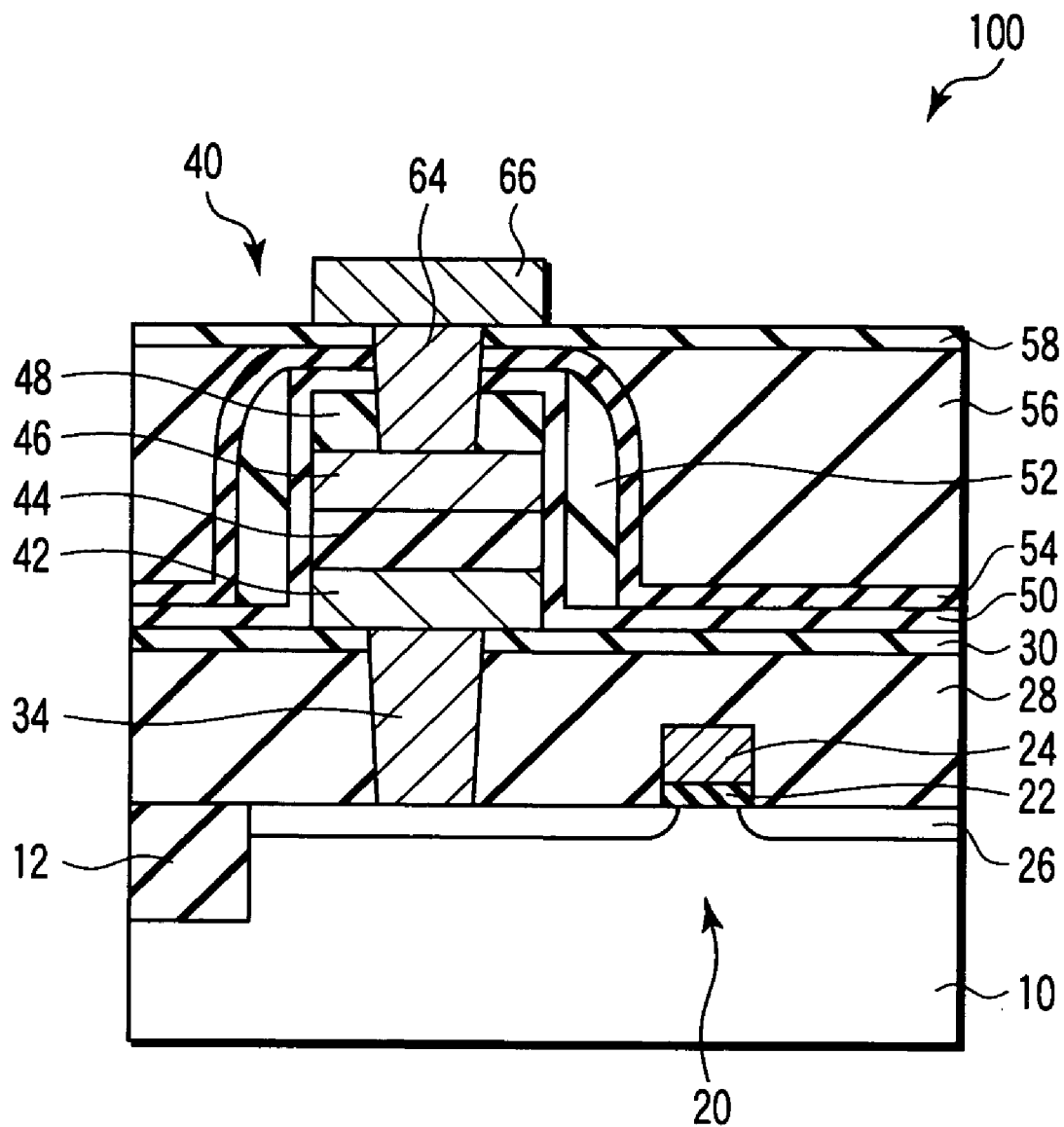
FIG. 1 is a sectional view showing an example of a semiconductor device according to a first embodiment of the present invention.

The embodiments of the present invention will be described with reference to the accompanying drawings. Throughout the drawings, corresponding portions are denoted by corresponding reference numerals. The embodiments are only examples, and various changes and modifications can be made without departing from the scope and spirit of the present invention.

The present invention provides a semiconductor memory device comprising a structure in which a side face of a contact plug connected to an upper electrode of a ferroelectric capacitor is covered with a hydrogen barrier film, and its manufacturing method. Hereinafter, the invention will be described in detail by way of several embodiments.

First Embodiment

FIG. 1 shows a sectional structure of a semiconductor memory device 100 according to a first embodiment of the present invention. The first embodiment is directed to a ferroelectric capacitor 40 patterned by using a second hydrogen barrier film 48 as a hard mask. The ferroelectric capacitor 40 is surrounded with first to fifth hydrogen barrier films 30, 48, 50, 54 and 58. Furthermore, a side face of a second contact plug 64 connected to an upper electrode 46 of the ferroelectric capacitor 40 is surrounded only with the hydrogen barrier films. With this structure, after formation of the ferroelectric capacitor 40, the penetration of hydrogen, moisture or the like to the ferroelectric capacitor 40 from its surrounding area including the second contact plug 64 can be prevented, thereby improving the characteristics and reliability of the semiconductor device.

An example of a manufacturing method of the semiconductor memory device of the invention will be described below with reference to process sectional views in FIGS. 2 to 8.

Figure 2:
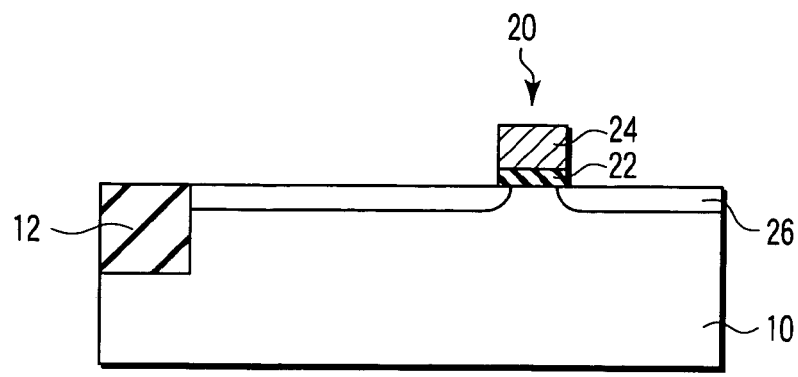
FIGS. 2 to 8 are process sectional views showing an example of a manufacturing process of the semiconductor device of the first embodiment.

(1) First, as shown in FIG. 2, a MOS transistor 20 is being formed on a semiconductor substrate 10, e.g., a silicon substrate 10.

Referring to FIG. 2, a well (not shown) and an isolation 12 are formed in the silicon substrate 10. Then, a gate insulator 22 is formed on an entire surface of the silicon substrate 10. As the gate insulator, for example, a silicon oxide ($SiO_2$) film, a silicon nitride (SiN) film, a silicon oxy-nitride (SiON) film, or a high-dielectric-constant insulator or the like having a dielectric constant higher than that of the $SiO_2$ film can be used. A conductive material for a gate electrode 24, e.g., a polycrystal silicon doped with a high concentration of phosphorus (P), a refractory metal such as tungsten (W) or molybdenum (Mo), or a silicide of these metals, is deposited on the gate insulator 22. The conductive material for the gate electrode is processed by lithography and etching to form a gate electrode 24. By using the gate electrode 24 as a mask, for example, a high concentration of arsenic (As) is doped by ion implantation to form a source/drain 26. Accordingly, the MOS transistor 20 shown in FIG. 2 is formed on the semiconductor substrate 10.

Figure 3:
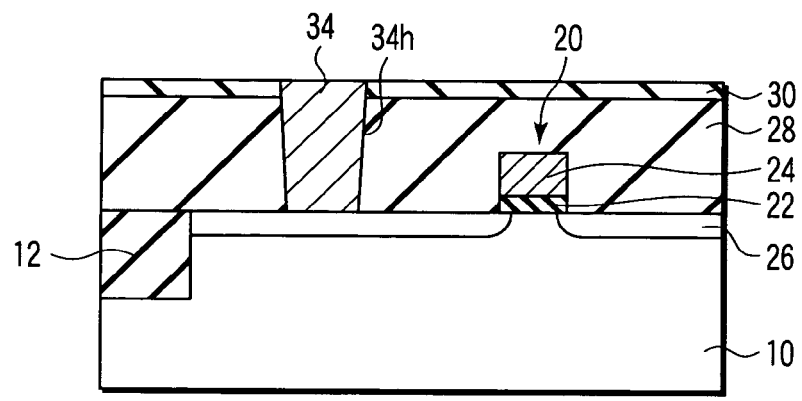

(2) Next, as shown in FIG. 3, the MOS transistor 20 is being planarized by a first interlevel insulator 28, a first hydrogen barrier film 30 is being formed on an entire surface, and a first contact plug 34 is being formed.

Referring to FIG. 3, the first interlevel insulator 28 is deposited on an entire surface of the MOS transistor 20. Then, the first interlevel insulator 28 is planarized by, e.g., chemical mechanical polishing (CMP). As the first interlevel insulator 28, for example, a boron phosphorous silicate glass (BPSG), or a plasma-assisted tetraethoxy silane (P-TEOS) can be used. The first hydrogen barrier film 30 is deposited on an entire surface of the first interlevel insulator 28. As the first hydrogen barrier film, for example, an aluminum oxide ($Al_2O_3$) film, a silicon nitride (SiN) film, SiON film, a titanium oxide ($TiO_2$) film, or the like can be used.

A first contact hole 34h reaching the source/drain 26 is formed in the first interlevel insulator 28 and the first hydrogen barrier film 30 by lithography and etching. For example, tungsten (W) or phosphorus doped polycrystal silicon is deposited to fill the first contact hole 34h. Then, the tungsten (W) or the phosphorus doped polycrystal silicon deposited on the surface is removed by CMP using, e.g., the first hydrogen barrier film 30 as a stopper, thus the first contact plug 34 is formed.

Accordingly, as shown in FIG. 3, the first hydrogen barrier film 30 and the first contact plug 34 are formed. It should be noted that the first hydrogen barrier film 30 could be omitted as described later.

Figure 4:
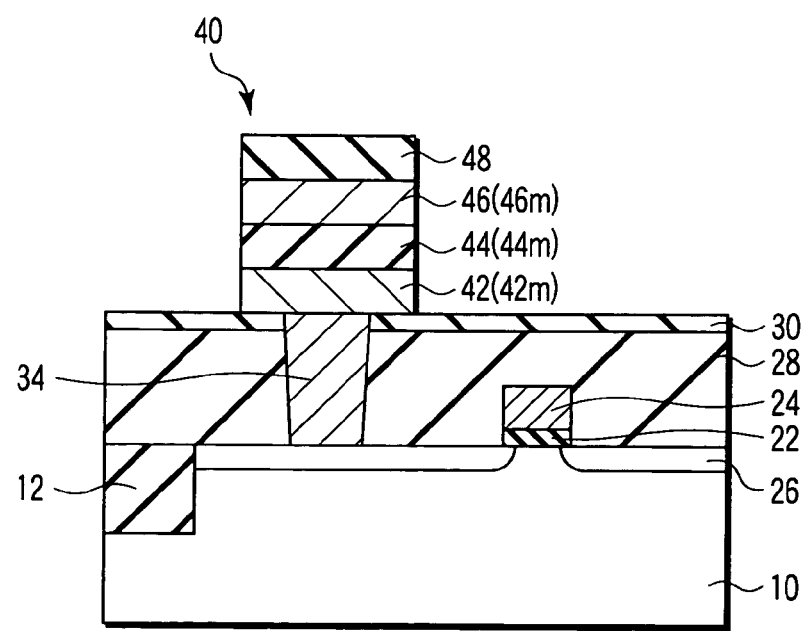

(3) Next, as shown in FIG. 4, a ferroelectric capacitor 40 is being formed on the first contact plug 34. In the processing, a second hydrogen barrier film 48 is being used as a hard mask.

Referring to FIG. 4, materials for a lower electrode 42m, a ferroelectric film 44m and an upper electrode 46m are sequentially deposited on an entire surface including on the first hydrogen barrier film 30. For the lower electrode material 42m of the ferroelectric capacitor 40, a conductive material having an oxygen diffusion prevention capability is preferable. For example, a material containing iridium (Ir), iridium oxide ($IrO_2$), ruthenium (Ru), ruthenium oxide ($RuO_2$), titanium aluminum nitride (TiAlN), titanium nitride (TiN), platinum (Pt) or strontium ruthenium oxide (SrRuO), or a stacked film thereof can be used. For the ferroelectric film 44m, a metal oxide having a perovskite structure, e.g., lead zirconium titanate (PZT) or strontium bismuth tantalate (SBT), can be used. For the upper electrode material 46m, as in the case of the lower electrode material 42m, for example, Ir, $IrO_2$, Ru, $RuO_2$, Pt or SrRuo, or a stacked film thereof can be used.

Subsequently, a second hydrogen barrier film 48, e.g., $Al_2O_3$ film, is deposited thickly on the upper electrode material 46m by sputtering. Additionally, a mask $SiO_2$ film (not shown) is deposited on the second hydrogen barrier film 48. The mask $SiO_2$ film is processed by lithography and etching to form a pattern of the ferroelectric capacitor 40. By using the mask $SiO_2$ film as a mask, an etching is performed to transfer the pattern of the ferroelectric capacitor 40 on the mask $SiO_2$ film to the second hydrogen barrier film 48. By using the second hydrogen barrier film 48 as a hard mask, the upper electrode material 46m, the ferroelectric film material 44m and the lower electrode material 42m are sequentially processed by etching to form the ferroelectric capacitor 40 connected to the first contact plug 34. Even after the formation of the ferroelectric capacitor 40, the second hydrogen barrier film 48 preferably has a thickness of 100 nm or more.

Accordingly, as shown in FIG. 4, the ferroelectric capacitor 40 having the thick hydrogen barrier film 48 on the upper surface can be formed.

Figure 5:
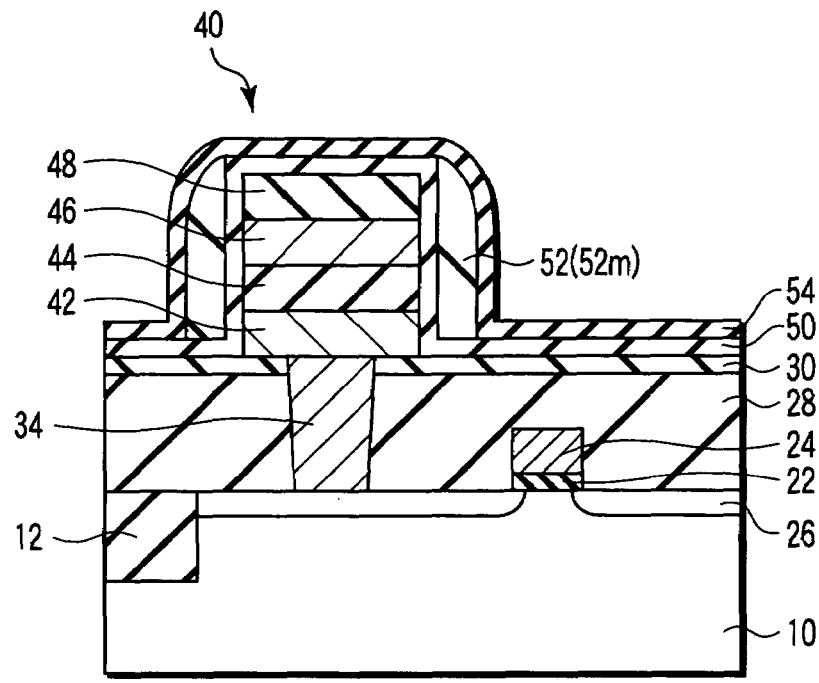

(4) Next, as shown in FIG. 5, a third hydrogen barrier film 50, a sidewall 52 and a fourth hydrogen barrier film 54 are being formed on a side face of the ferroelectric capacitor 40.

Referring to FIG. 5, the third hydrogen barrier film 50 is formed on an entire surface including a side face of the ferroelectric capacitor 40. For example, for the third hydrogen barrier film 50, $Al_2O_3$ film is preferably formed by a method with better step coverage, e.g., ALD. The third hydrogen barrier film 50 prevents penetration of hydrogen or the like to the ferroelectric capacitor 40 from a horizontal side.

Next, to form the sidewall 52 on the side face of the ferroelectric capacitor 40, $SiO_2$ film 52m is deposited on an entire surface. The $SiO_2$ film 52m is etched by anisotropic RIE to remove the $SiO_2$ film 52m on a plane surface, and the $SiO_2$ film 52m is left only on the side face of the ferroelectric capacitor 40 in a self-aligned manner. Thus, the sidewall 52 is formed.

Further, the fourth hydrogen barrier film 54 is deposited on an entire surface including on the side face of the sidewall 52. Whereby, even if an etching residue is formed on the side face of the ferroelectric capacitor 40 to cause insufficient coverage of the third hydrogen diffusion baffler film 50, the fourth hydrogen diffusion barrier film 54 formed on the sidewall 52 can cover the ferroelectric capacitor 40 well without being affected by the etching residue. Thus, in a process of multilevel wiring or the like, diffusion and penetration of hydrogen or moisture to the ferroelectric capacitor 40 can be prevented more effectively.

For the third and fourth hydrogen barrier films 52, 54, as in the case of the other hydrogen barrier films, for example, $Al_2O_3$ film, SiN film or SiON film can be used.

Thus, as shown in FIG. 5, the third hydrogen barrier film 50, the sidewall 52 and the fourth hydrogen barrier film 54 are formed on the side face of the ferroelectric capacitor 40.

Figure 6:
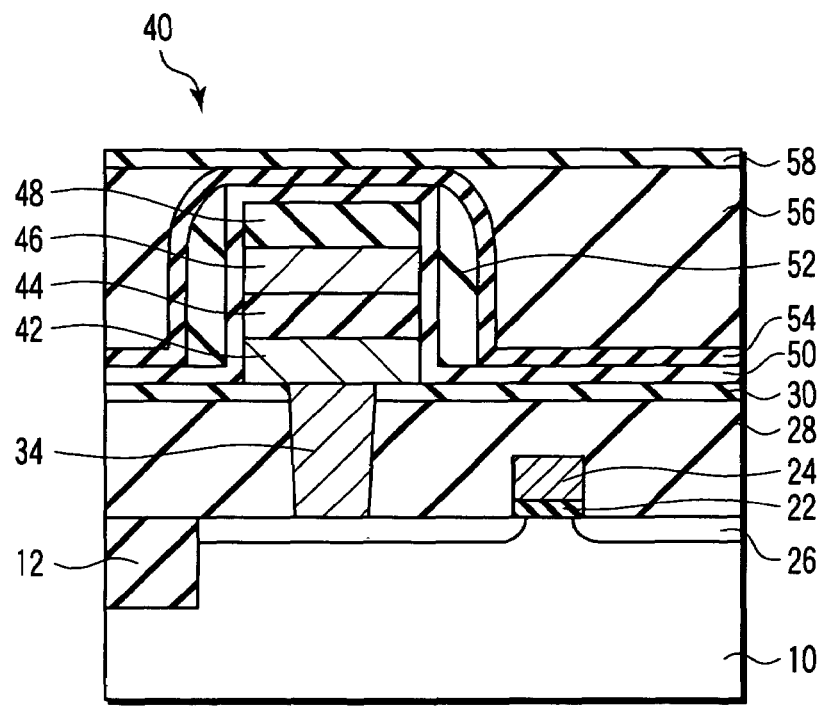

(5) Next, as shown in FIG. 6, the surrounding area of the ferroelectric capacitor 40 is being planarized by a second interlevel insulator 56, and a fifth hydrogen barrier film 58 is being formed on a surface.

Referring to FIG. 6, the second interlevel insulator 56 is deposited thickly to fill a gap between the ferroelectric capacitors 40. Then the second interlevel insulator 56 is planarized by CMP, for example, to fill the trench between the ferroelectric capacitors 40. As a material of the second interlevel insulator 56, for example, P-TEOS, $O_3$-TEOS, a spin-on-glass (SOG), or a low-dielectric-constant insulator such as a fluorine-added silicon oxide film (SiOF) or an organic silicon oxide film (SiOC) can be used.

Then, the fifth hydrogen barrier film 58 is deposited on an entire surface of the second interlevel insulator 56. The fifth hydrogen barrier film 58 can cover above the ferroelectric capacitor 40 well because it is formed on a flat surface and formed thickly. Thus, it has better hydrogen barrier characteristics.

Accordingly, as shown in FIG. 6, the surrounding area of the ferroelectric capacitor 40 is planarized by the second interlevel insulator 56, and the fifth hydrogen barrier film 58 is formed on the surface.

Figure 7:
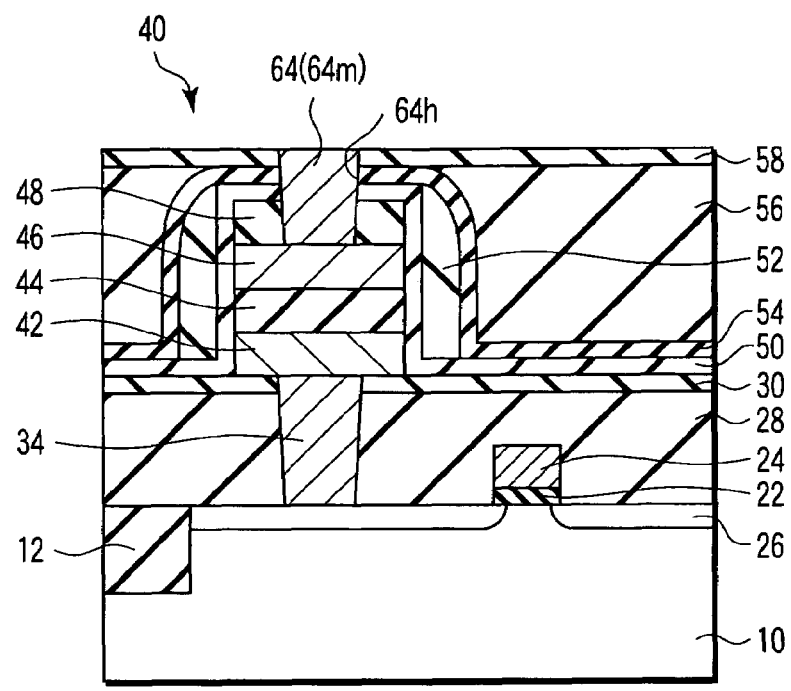

(6) Next, as shown in FIG. 7, a second contact plug 64 is being formed to be connected to the upper electrode 46 of the ferroelectric capacitor 40.

Referring to FIG. 7, in the second to fifth hydrogen barrier films 48, 50, 54 and 58 formed on the upper electrode 46 of the ferroelectric capacitor 40, a second contact hole 64h is formed by lithography and etching to reach the upper electrode 46. As the second to fifth hydrogen barrier films 48, 50, 54 and 58 are sequentially stacked to directly contact with each other, the side face of the second contact hole 64h is surrounded only by hydrogen barrier films.

Next, annealing is carried out for one hour in an atmosphere containing high-temperature oxygen, e.g., in an oxygen atmosphere at 650° C. Subsequently, a metal material 64m is deposited on an entire surface including inside of the second contact hole 64h. As the metal material 64m, for example, tungsten (W), aluminum (Al), copper (Cu), titanium (Ti), titanium nitride (TiN), tantalum (Ta), tantalum nitride (TaN), or a material containing one of these can be used. It can be formed by a method, for example, a metal organic chemical vapor deposition (MOCVD), a sputtering, a plating, a sputter reflowing or the like. The metal material 64m deposited on the surface of the fifth hydrogen barrier film 58 is removed and planarized simultaneously by, e.g., CMP.

Accordingly, the second contact plug 64 is formed to be connected to the upper electrode 46 of the ferroelectric capacitor 40 as shown in FIG. 7. As described above, the side face of the second contact plug 64 is covered only with the hydrogen baffler films 48, 50, 54 and 58. Thus, the diffusion of hydrogen, moisture or the like through the second contact plug 64 to the ferroelectric capacitor 40 can be prevented, and damage given to the ferroelectric capacitor 40 during the process after the formation of the ferroelectric capacitor 40 can be suppressed.

(7) Next, a first wiring 66 is being formed to be connected to the second contact plug 64.

Figure 8:
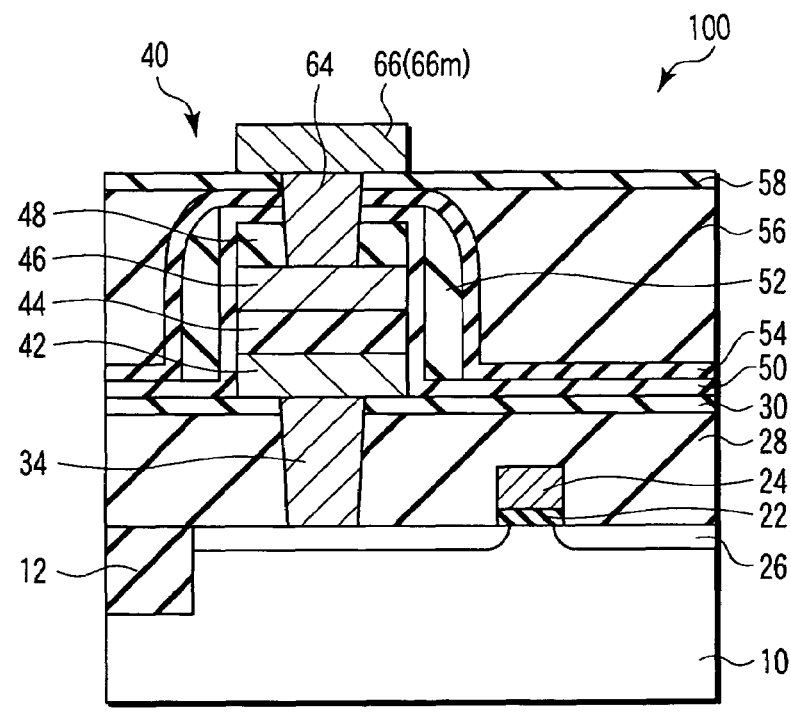

Referring to FIG. 8, a first wiring material 66m is deposited on an entire surface including on the second contact plug 64. As the first wiring material 66m, as in the case of the material of the second contact plug 64, for example, W, Cu or the like can be used. The first wiring material 66m is patterned by lithography and etching to form the first wiring 66 to be connected to the second contact plug 64.

Subsequently, a process such as multilevel wiring or the like necessary for the semiconductor device is carried out to complete the semiconductor memory device 100 including the ferroelectric random access memory.

The ferroelectric capacitor 40 formed in this manner has a structure in which all of the outer surfaces of the capacitor 40 are covered only with the hydrogen baffler films, and the side face of the second contact plug 64 connected to the upper electrode 46 is also covered only with the hydrogen baffler film. Thus a semiconductor memory device can be provided capable of preventing degradation of the characteristics of the ferroelectric capacitor 40 caused by the penetration of hydrogen, moisture or the like to the ferroelectric capacitor 40 from its surrounding area including the second contact plug 64 during the manufacturing process after the ferroelectric capacitor 40 is formed, and its manufacturing method.

The first embodiment can be implemented by various modifications. For example, one or some parts of the five hydrogen barrier films can be omitted. Some modifications thereof are shown in FIGS. 9 to 12.

MODIFICATION 1 OF FIRST EMBODIMENT

Figure 9:
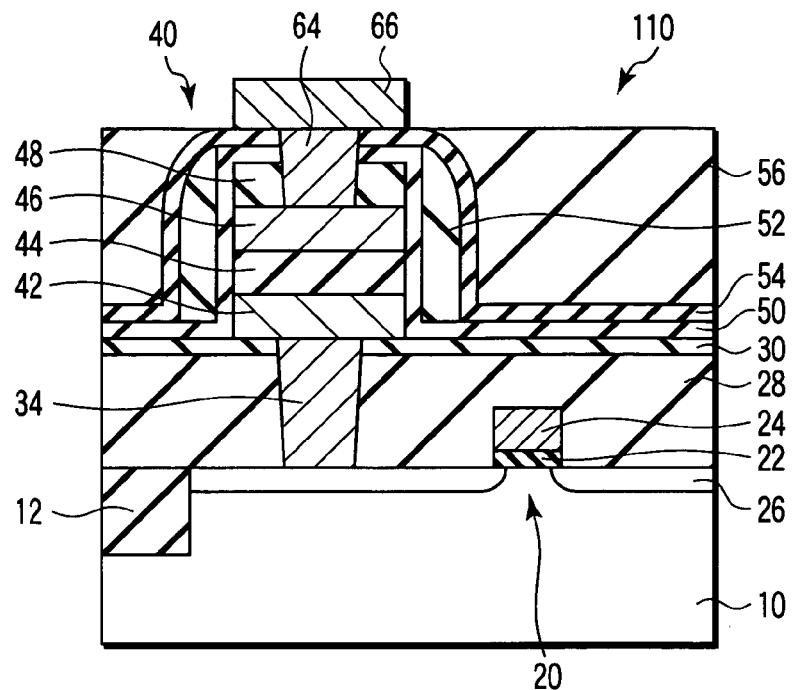
FIG. 9 is a sectional view showing an example of a semiconductor device according to modification 1 of the first embodiment of the invention.

As shown in FIG. 9, a semiconductor memory device 110 of modification 1 of the first embodiment has a structure in which the fifth hydrogen barrier film 58 formed on the second interlevel insulator 56 in the first embodiment is omitted.

In this case, by depositing second to fourth hydrogen baffler films 48, 50 and 54 sufficiently thickly, it can be formed a second contact plug 64 in the hydrogen baffler films 48, 50 and 54 on an upper electrode 46 of the ferroelectric capacitor 40. Further, as the side face side of the ferroelectric capacitor 40 is covered with the thick third and fourth hydrogen barrier films 50, 54, and thus, the penetration of hydrogen, moisture or the like thereto from the outside including its horizontal side can be prevented, and thereby the degradation of the characteristics of the ferroelectric capacitor 40 is prevented.

MODIFICATION 2 OF FIRST EMBODIMENT

Figure 10:
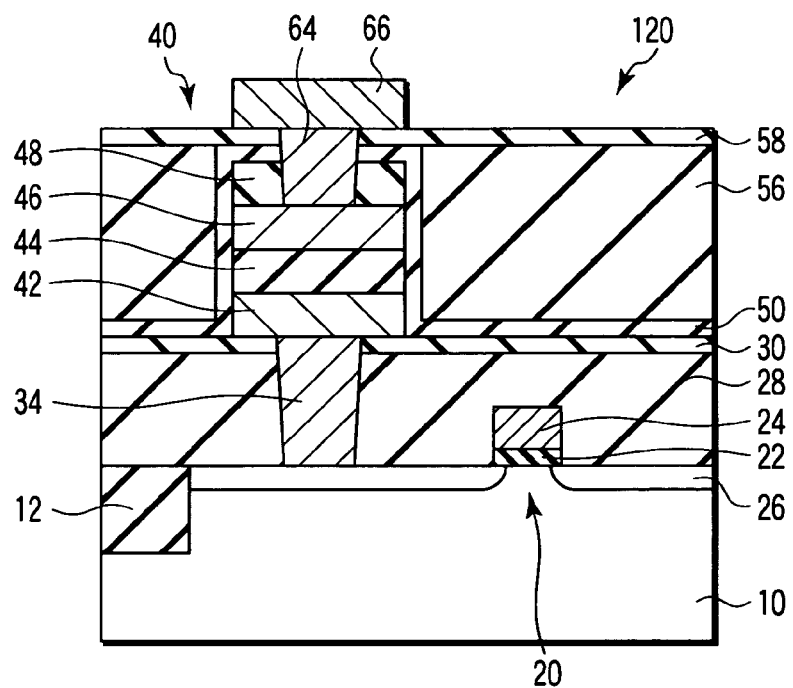
FIG. 10 is a sectional view showing an example of a semiconductor device according to modification 2 of the first embodiment of the invention.

As shown in FIG. 10, a semiconductor memory device 120 of modification 2 of the first embodiment has a structure in which the sidewall 52 and the fourth hydrogen barrier film 54 formed on the side face of the ferroelectric capacitor 40 in the first embodiment are omitted.

In this case, it is important to deposit the second, third and fifth hydrogen barrier films 48, 50 and 58 sufficiently thickly. By forming the second hydrogen barrier film 48 thickly, it can be formed the second contact plug 64 in the hydrogen baffler films 48, 50 and 58 on the upper electrode 46 of the ferroelectric capacitor 40. And thus it is prevented the penetration of hydrogen, moisture or the like through the second contact plug 64 to the ferroelectric capacitor 40. Further, in the horizontal side of the ferroelectric capacitor 40, the fifth hydrogen barrier film 58 is formed above the ferroelectric capacitor 40, and the thick third hydrogen baffler film 50 is formed on the side face of the ferroelectric capacitor 40. Thus, the penetration of hydrogen, moisture or the like thereto from the outside including its horizontal side can be prevented, and thereby the degradation of the characteristics of the ferroelectric capacitor 40 is prevented.

MODIFICATION 3 OF FIRST EMBODIMENT

Figure 11:
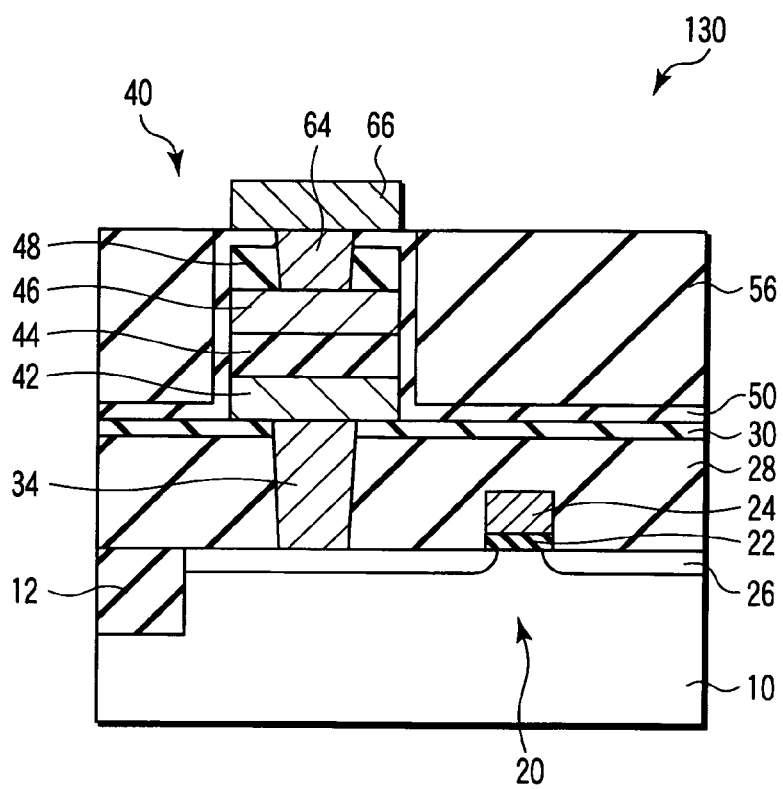
FIG. 11 is a sectional view showing an example of a semiconductor device according to modification 3 of the first embodiment of the invention.

As shown in FIG. 11, a semiconductor memory device 130 of modification 3 of the first embodiment has a structure in which the fifth hydrogen barrier film 58 formed on the second interlevel insulator 56 in the modification 2 of the first embodiment is omitted.

In this case, as second and third hydrogen baffler films 48, 50 are only formed in the horizontal side of the ferroelectric capacitor 40, it is important to deposit the second hydrogen barrier film 48 sufficiently thickly, and to improve the coverage on the side face of the ferroelectric capacitor 40 by the third baffler film 50. By forming the second hydrogen barrier film 48 thickly, it can be formed the second contact plug 64 in the thick hydrogen barrier films 48, 50 on the upper electrode 46 of the ferroelectric capacitor 40 so that the side face of the second contact plug 64 is covered only with the hydrogen baffler films. And thus the penetration of hydrogen, moisture or the like through the second contact plug 64 to the ferroelectric capacitor 40 is prevented. Further, in the horizontal side of the ferroelectric capacitor 40, the thick third hydrogen barrier film 50 is formed on the side face of the ferroelectric capacitor 40. Thus, the penetration of hydrogen, moisture or the like thereto from the outside including its horizontal side can be prevented, and thereby the degradation of the characteristics of the ferroelectric capacitor 40 is prevented.

MODIFICATION 4 OF FIRST EMBODIMENT

A semiconductor memory device 140 of modification 4 of the first embodiment has a structure in which the first hydrogen barrier film 30 below the ferroelectric capacitor 40 is omitted, and it can be applied to any one of the structures of the first embodiment, the modifications 1 to 3, and other modifications.

Figure 12:
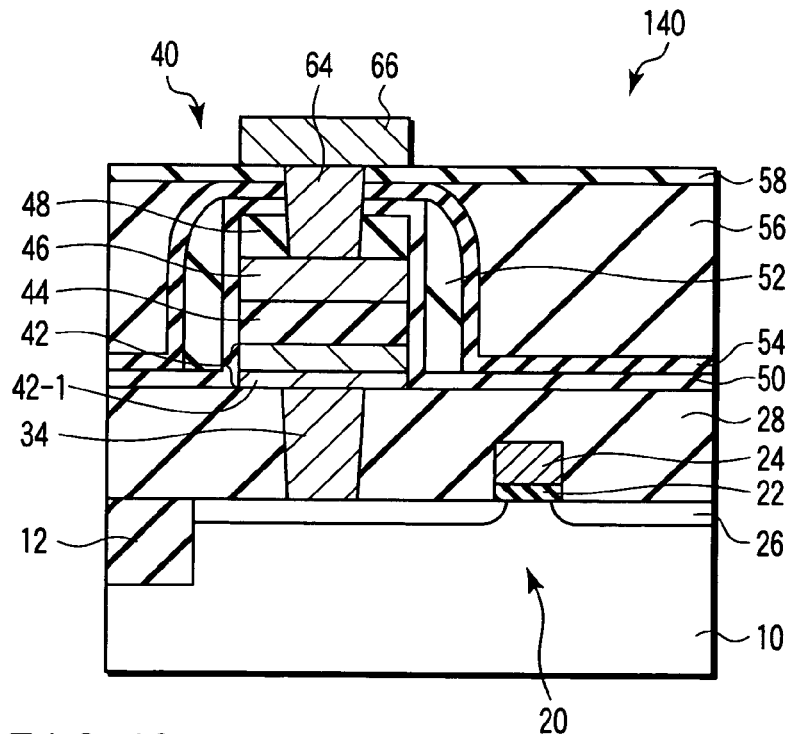
FIG. 12 is a sectional view showing an example of a semiconductor device according to modification 4 of the first embodiment of the invention.
Figure 13:
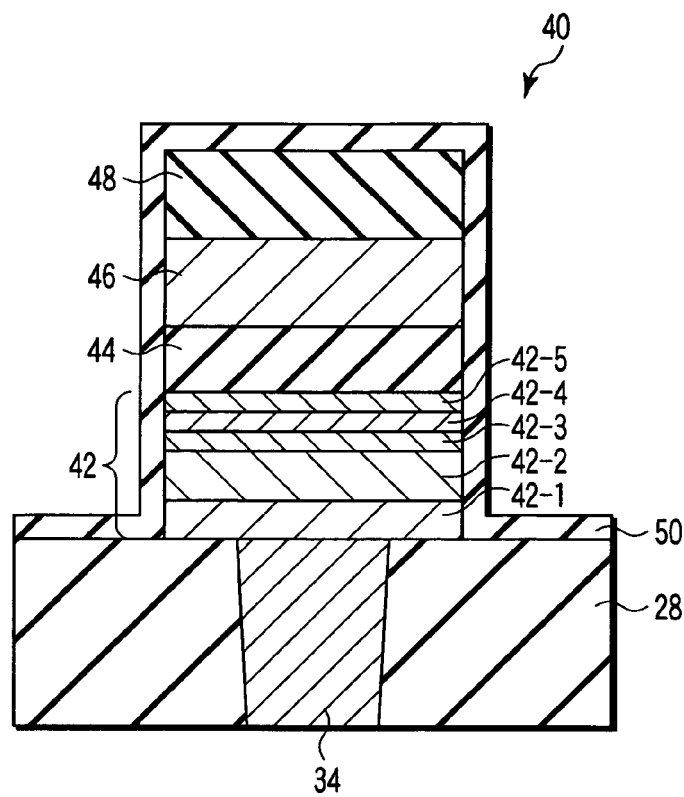
FIG. 13 is an enlarged sectional view of a ferroelectric capacitor of FIG. 12.

As an example, FIG. 12 shows a structure in which the first hydrogen barrier film 30 is omitted from the first embodiment. In the case of omitting the first hydrogen barrier film 30, the hydrogen barrier characteristics of the lower electrode 42 of the ferroelectric capacitor 40 must be increased to prevent the penetration of hydrogen or the like from the lower side of the ferroelectric capacitor 40. The lower electrode 42 is formed preferably in a laminated structure, and it can be used a stacked film in which a material with a high hydrogen barrier characteristics, e.g., TiAlN or TiN, is used for the lowermost layer 42-1, and any of e.g., Ir, $IrO_2$, Pt, or SrRuO usually used for the lower electrode are deposited thereon. Specifically, as an example of an enlarged view shown in FIG. 13, the lower electrode 42 can comprise a laminated structure of TiAlN 42-1, Ir 42-2, $IrO_2$ 42-3, Pt 42-4 and SrRuO 42-5.

According to the structure of the modification, the side face of the second contact plug 64 contacts only with the hydrogen barrier films, and upper and side faces of the ferroelectric capacitor 40 are also covered with the hydrogen barrier films.

By forming the structure of the lower electrode 42 of the ferroelectric capacitor 40 and the hydrogen barrier films surrounding the same in the aforementioned manner, the penetration of hydrogen, moisture or the like to the ferroelectric capacitor 40 from the surrounding area including its horizontal side can be prevented, and thereby the degradation of the characteristics of the ferroelectric capacitor 40 is prevented.

As described above, according to the first embodiment and its modifications, a semiconductor memory device can be provided capable of preventing the penetration of hydrogen, moisture or the like to the ferroelectric capacitor 40 from its surrounding area including the second contact plug 64, and its manufacturing method.

SECOND EMBODIMENT

The first embodiment has been descried by way of example in which only the hydrogen barrier films are formed on the upper electrode 46 of the ferroelectric capacitor 40, and the second contact plug 64 is formed therein. There is a case in which on the ferroelectric capacitor 40, not only the hydrogen barrier films but also films having no hydrogen barrier characteristics such as interlevel insulators can be formed.

Figure 14:
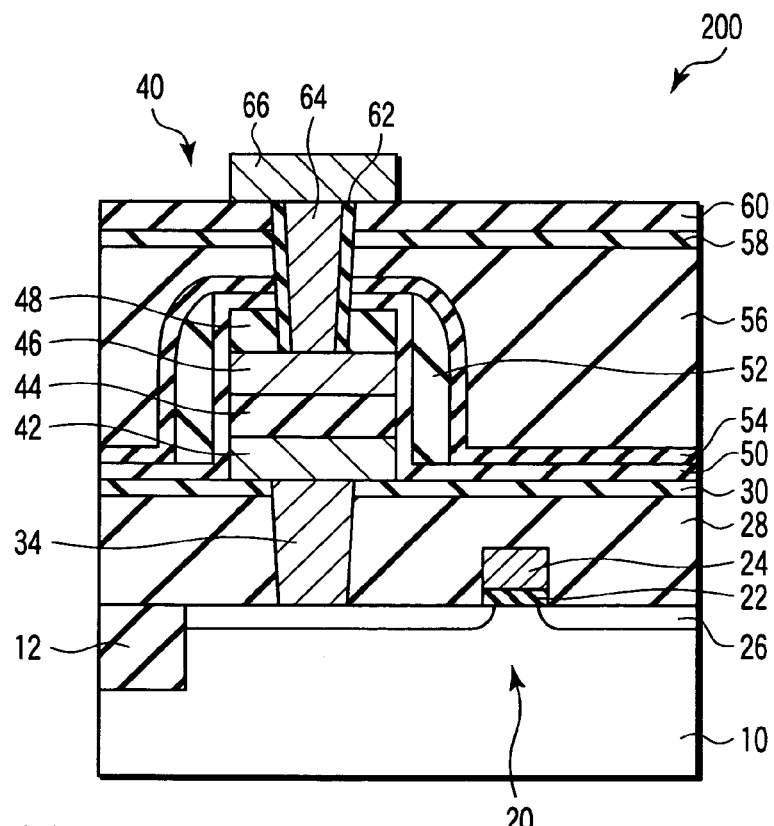
FIG. 14 is a sectional view showing an example of a semiconductor device according to a second embodiment of the present invention.

A semiconductor memory device 200 of a second embodiment has a structure in which a second contact plug 64 reaching an upper electrode 46 is formed in insulators including such a film of no hydrogen barrier characteristics formed on a ferroelectric capacitor 40. For example, as shown in FIG. 14, second to fifth hydrogen barrier films 48, 50, 54 and 58 and a third interlevel insulator 60 are formed on an upper electrode 46 of the ferroelectric capacitor 40. A second contact plug 64 is formed through these films to reach the upper electrode 46, and a sixth hydrogen barrier film 62 is formed on a side face of the second contact plug 64. Accordingly, the penetration of hydrogen, moisture or the like from the side face of the second contact plug 64 to the ferroelectric capacitor 40 through the second contact plug 64 is prevented. A method of manufacturing the semiconductor device of the second embodiment will be described with reference to FIGS. 15 to 17.

Figure 15:
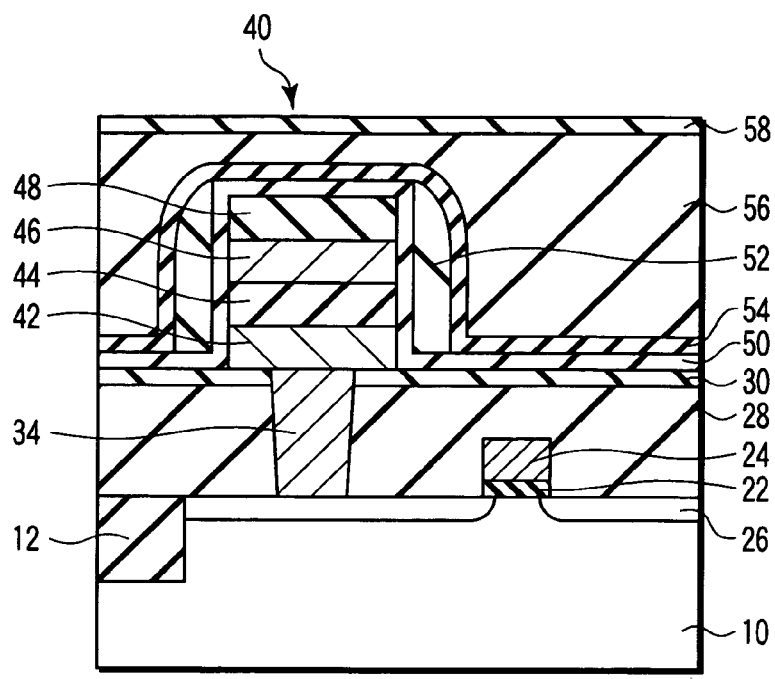
FIGS. 15 to 17 are process sectional views showing an example of a manufacturing process of the semiconductor device of the second embodiment.

FIG. 15 shows a structure in which processes of planarizing a second interlevel insulator 56 after filling a gap between ferroelectric capacitors 40, and forming the fifth hydrogen barrier film 58 thereon. The manufacturing process thus far is similar to that from the step (1) to the step (5) of the first embodiment, and thus explanation thereof will be omitted. According to the embodiment, the second interlevel insulator 56 may be planarized either to an upper surface of the fourth hydrogen barrier film 54, or to be left thereon. As shown in FIG. 15, the second interlevel insulator 56 may be present between the fourth and fifth hydrogen barrier films 54 and 58.

Figure 16:
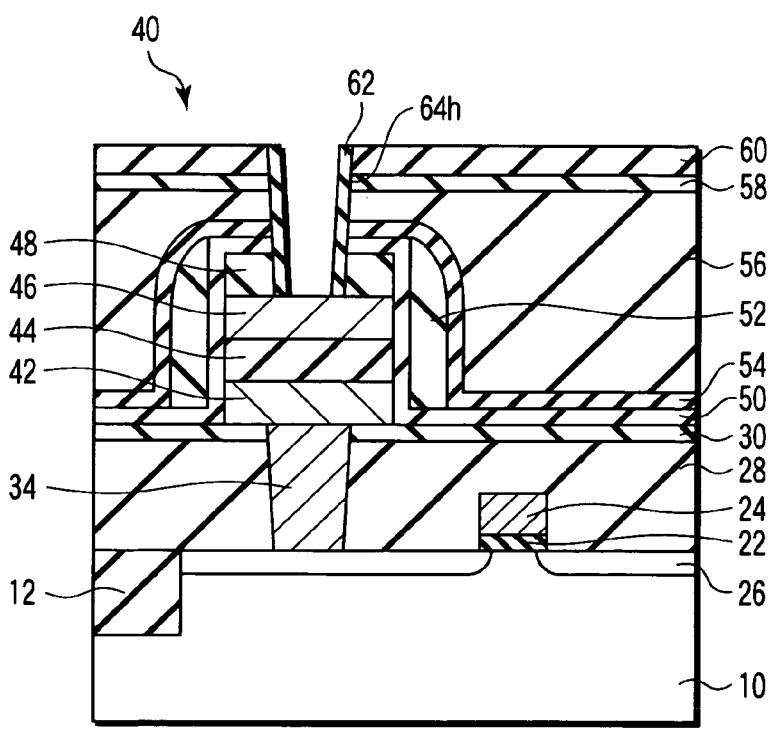

(6) Next, as shown in FIG. 16, a third interlevel insulator 60 is being deposited. Further, a second contact hole 64h, which reaches the upper electrode 46 of the ferroelectric capacitor 40 and on a side face of which a sixth hydrogen barrier film 62 is formed, is being processed.

Referring to FIG. 16, the third interlevel insulator 60 is deposited on an entire surface of the fifth hydrogen barrier film 58. The third interlevel insulator 60 is preferably a low-dielectric constant insulator as in the case of the first and second interlevel insulators 28, 56.

Then, in the second and third interlevel insulators 56, 60 and the second to fifth hydrogen barrier films 48, 50, 54 and 58, the second contact hole 64h is formed by lithography and etching to reach the upper electrode 46 of the ferroelectric capacitor 40.

The sixth hydrogen barrier film 62 is formed on an entire surface including on an inner surface of the second contact hole 64h, by, e.g., CVD. As the sixth hydrogen barrier film 62, for example, an $Al_2O_3$ film, an SiN film or the like can be used as in the case of the other hydrogen barrier films. Subsequently, the sixth hydrogen barrier film 62 deposited on the bottom of the second contact hole 64h is removed by anisotropic etching. By this anisotropic etching, the sixth hydrogen barrier film 62 deposited on the surface of the third interlevel insulator 60 is also removed.

Accordingly, as shown in FIG. 16, the sixth hydrogen barrier film 62 can be formed on the side face of the second contact hole 64h.

Figure 17:
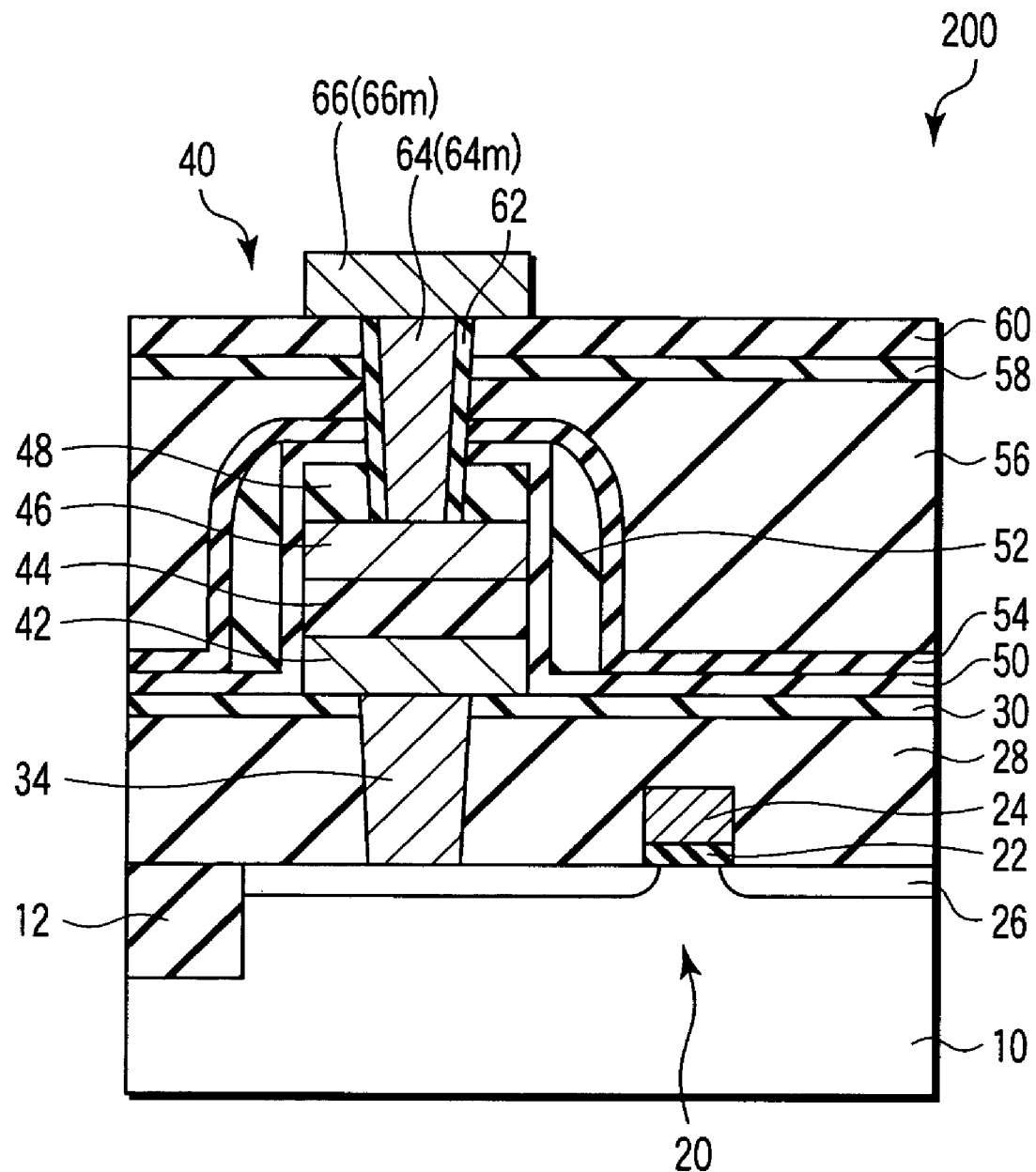

(7) Next, as shown in FIG. 17, a second contact plug 64 and a first wiring 66 are being formed.

First, annealing is carried out for one hour in an atmosphere containing high-temperature oxygen, e.g., in an oxygen atmosphere at 650° C., to recover damage given to the ferroelectric capacitor 40.

Referring to FIG. 17, a metal material 64m is deposited on an entire surface to fill the inside of the second contact hole 64h. As the metal material 64m, for example, W, Al, Cu or the like, or a material containing one of these can be used as in the case of the first embodiment. The metal material 64m deposited on the surface of the sixth hydrogen barrier film 62 is removed and planarized simultaneously by, e.g., CMP, thus the second contact plug 64 is formed.

The side face of the second contact plug 64 is covered with the sixth hydrogen barrier film 62. Accordingly, diffusion of hydrogen, moisture or the like through the second contact plug 64 to the ferroelectric capacitor 40 can be prevented, and damage to the ferroelectric capacitor 40 during the process after its formation can be suppressed.

Next, a first wiring material 66m is deposited on an entire surface including on the second contact plug 64. As the first wiring material 66m, for example, W, Cu or the like can be used as in the case of the material of the second contact plug 64. The first wiring material 66m is patterned by lithography and etching to form the first wiring 66 to be connected to the second contact plug 64.

It should be noted that the second contact plug 64 and the first wiring 66 could be simultaneously formed.

Subsequently, a process such as multilevel wiring necessary for the semiconductor device is carried out to complete the semiconductor memory device 200 including a ferroelectric random access memory.

As in the case of the first embodiment, the thus formed ferroelectric capacitor 40 has a structure in which all of the outer surfaces thereof are covered only with the hydrogen barrier films, and the side face of the second contact plug 64 connected to the upper electrode 46 is also covered with the sixth hydrogen barrier film 62. Thus a semiconductor memory device can be provided capable of preventing degradation of the characteristics of the ferroelectric capacitor 40 caused by the penetration of hydrogen, moisture or the like to the ferroelectric capacitor 40 from its surrounding area including the second contact plug 64 during the manufacturing process after the ferroelectric capacitor 40 is formed, and its manufacturing method.

The second embodiment can be implemented by various modifications as in the case of the first embodiment. For example, one or some parts of the six hydrogen barrier films can be omitted. Some modifications thereof are shown in FIGS. 18 to 21.

MODIFICATION 1 OF SECOND EMBODIMENT

Figure 18:
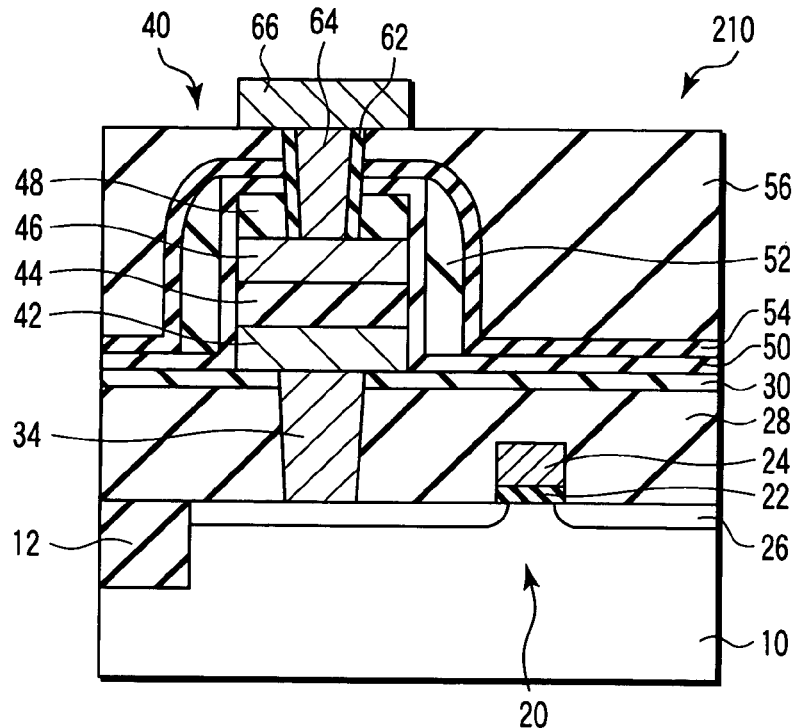
FIG. 18 is a sectional view showing an example of a semiconductor device according to modification 1 of the second embodiment of the invention.

As shown in FIG. 18, a semiconductor memory device 210 of modification 1 of the second embodiment has a structure in which the fifth hydrogen barrier film 58 formed on the second interlevel insulator 56 in the second embodiment is omitted.

In this case, by depositing the second interlevel insulator 56 thickly and then planarizing it, the third interlevel insulator 60 can be omitted. The sixth hydrogen barrier film 62 is formed on the side face of the second contact plug 64, and the side face side of the ferroelectric capacitor 40 is covered with thick third and fourth hydrogen barrier films. Thus, the penetration of hydrogen, moisture or the like to the ferroelectric capacitor 40 from the surrounding area including its horizontal side can be prevented, and thereby the degradation of the characteristics of the ferroelectric capacitor 40 is prevented.

MODIFICATION 2 OF SECOND EMBODIMENT

Figure 19:
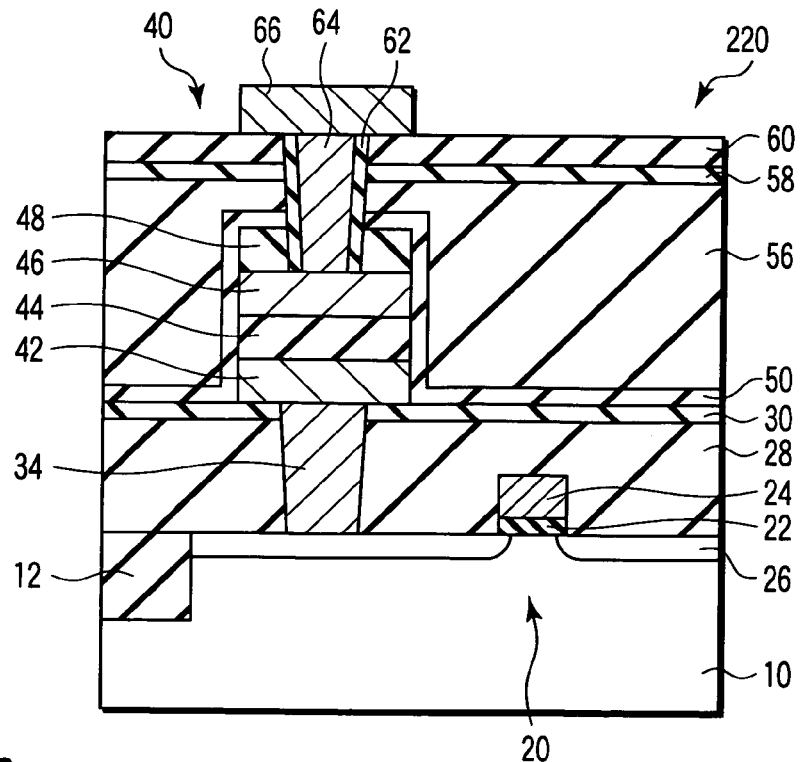
FIG. 19 is a sectional view showing an example of a semiconductor device according to modification 2 of the second embodiment of the invention.

As shown in FIG. 19, a semiconductor memory device 220 of modification 2 of the second embodiment has a structure in which the sidewall 52 and the fourth hydrogen barrier film 54 formed on the side face of the ferroelectric capacitor 40 of the second embodiment are omitted.

In this case, the second contact plug 64 is formed in the hydrogen baffler films 48, 58, and the second and third interlevel insulators 56, 60 on the upper electrode 46 of the ferroelectric capacitor 40. The sixth hydrogen baffler film 62 is formed on the side face of the second contact plug 64. Above the ferroelectric capacitor 40, the fifth hydrogen baffler film 58 is formed to widely cover even in the upper horizontal side thereof and the side face of the ferroelectric capacitor 40 is covered with the third hydrogen baffler film 50. Thus, the penetration of hydrogen, moisture or the like to the ferroelectric capacitor 40 from the surrounding area including its horizontal side can be prevented, and thereby the degradation of the characteristics of the ferroelectric capacitor 40 is prevented.

MODIFICATION 3 OF SECOND EMBODIMENT

Figure 20:
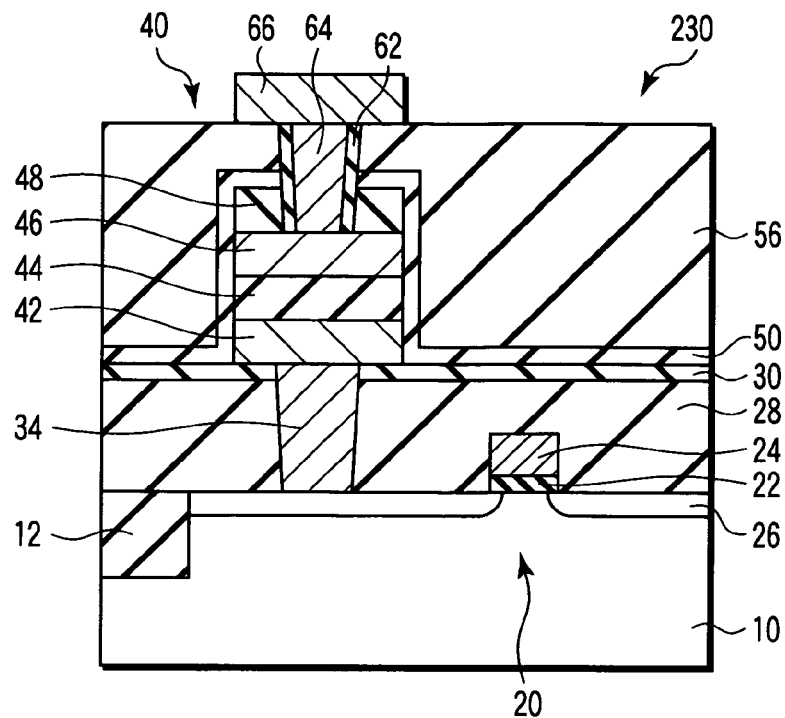
FIG. 20 is a sectional view showing an example of a semiconductor device according to modification 3 of the second embodiment of the invention.

As shown in FIG. 20, a semiconductor memory device 230 of modification 3 of the second embodiment has a structure in which the fifth hydrogen baffler film 58 formed on the second interlevel insulator 56 and the third interlevel insulator 60 are omitted from the modification 2 of the second embodiment.

In this case, as the third hydrogen baffler film 50 is only formed in the horizontal side of the ferroelectric capacitor 40, it is important to improve the coverage of the side face of the ferroelectric capacitor 40 by the third hydrogen baffler film 50, and to deposit sufficiently thickly thereof. The side face of a second contact plug 64 is also covered with the sixth hydrogen baffler film 62. Thus, the penetration of hydrogen, moisture or the like to the ferroelectric capacitor 40 from the surrounding area including its horizontal side can be prevented, and thereby the degradation of the characteristics of the ferroelectric capacitor 40 is prevented.

MODIFICATION 4 OF SECOND EMBODIMENT

A semiconductor memory device 240 of modification 4 of the second embodiment has a structure in which the first hydrogen barrier film 30 below the ferroelectric capacitor 40 is omitted, and it can be applied to any one of the structures of the second embodiment, the modifications 1 to 3, and other modifications.

Figure 21:
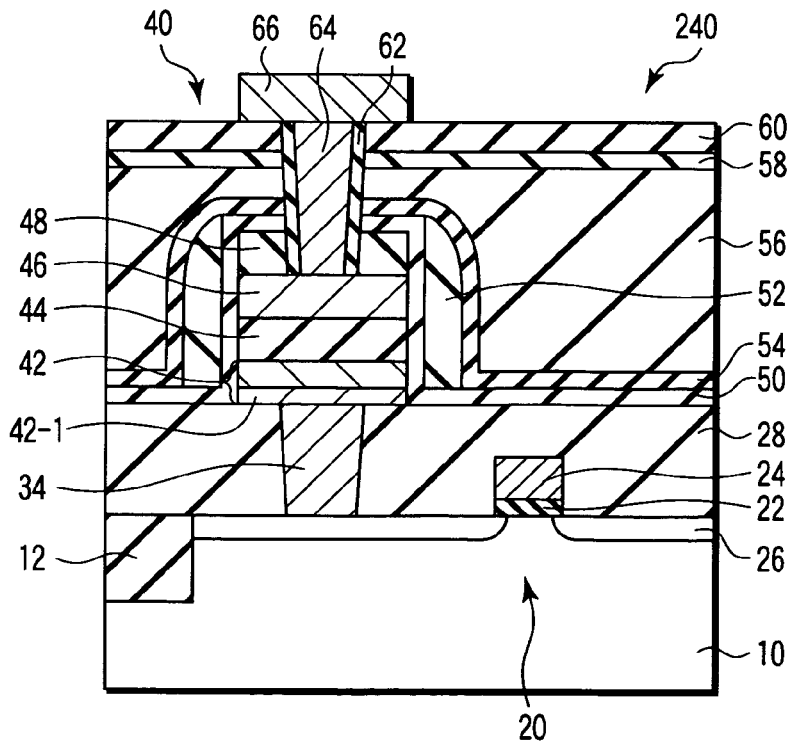
FIG. 21 is a sectional view showing an example of a semiconductor device according to modification 4 of the second embodiment of the invention.

As an example, FIG. 21 shows a structure in which the first hydrogen barrier film 30 is omitted from the second embodiment. In the case of omitting the first hydrogen barrier film 30, as in the case of the modification 4 of the first embodiment, the hydrogen barrier characteristics of the lower electrode 42 of the ferroelectric capacitor 40 must have a increased capability preventing the penetration of hydrogen or the like from the lower side of the ferroelectric capacitor 40. In this case, as described above with reference of the modification 4 of the first embodiment and the enlarged view in FIG. 13, for example, the lower electrode 42 can comprise the laminated structure of TiAlN 42-1, Ir 42-2, IrO$_2$ 42-3, Pt 42-4 and SrRuO 42-5.

According to the structure of the modification, the side face of the second contact plug 64 is covered with the sixth hydrogen baffler film 62, and the upper and side faces of the ferroelectric capacitor 40 are covered with thick hydrogen baffler films 48, 50. Thus, the penetration of hydrogen, moisture or the like to the ferroelectric capacitor 40 from the outside including its horizontal side and through the second contact plug 64 can be prevented, and thereby the degradation of the characteristics of the ferroelectric capacitor 40 is prevented.

As described above, according to the present invention, a semiconductor memory device can be provided capable of preventing the penetration of hydrogen, moisture or the like to the ferroelectric capacitor 40 from its surrounding area including the second contact plug 64, and its manufacturing method.

Materials, forming places and application of the hydrogen barrier films of the invention are not limited to the embodiments, and various modifications can be made to the implementation.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device, comprising:
    a ferroelectric capacitor formed above a semiconductor substrate;
    a first hydrogen barrier insulating film formed on an upper surface of the ferroelectric capacitor and having a same area as an area of the upper surface of the ferroelectric capacitor;
    a second hydrogen barrier insulating film formed to cover the first hydrogen barrier insulating film and the ferroelectric capacitor, and contacting with an upper surface of the first hydrogen barrier insulating film and all side faces of the ferroelectric capacitor; and
    a contact plug disposed fully through the first and second hydrogen barrier insulating films, and connected to an upper electrode of the ferroelectric capacitor, all side faces thereof being fully covered with hydrogen barrier insulating material.

2. The semiconductor memory device according to claim 1, further comprising a third hydrogen barrier insulating film which fully covers only and all side faces of the contact plug.

3. The semiconductor memory device according to claim 2, further comprising:
    a sidewall insulator disposed only on all side faces of the second hydrogen barrier insulating film; and
    a fourth hydrogen barrier insulating film disposed to cover the sidewall insulator and the second hydrogen barrier insulating film.

4. The semiconductor memory device according to claim 2, further comprising:
    an interlevel insulator formed around the ferroelectric capacitor; and
    a fourth hydrogen insulating barrier film formed above the interlevel insulator.

5. The semiconductor memory device according to claim 2, wherein the ferroelectric capacitor is formed on a lower hydrogen barrier insulating film.

6. The semiconductor memory device according to claim 1, further comprising:
    a sidewall insulator disposed only on all side faces of the second hydrogen barrier insulating film; and
    a third hydrogen barrier insulating film disposed to cover the sidewall insulator and the second hydrogen barrier insulating film.

7. The semiconductor memory device according to claim 6, further comprising:
    an interlevel insulator formed around the ferroelectric capacitor; and
    a fourth hydrogen barrier insulating film formed above the interlevel insulator.

8. The semiconductor memory device according to claim 6, wherein the ferroelectric capacitor is formed on a lower hydrogen barrier insulating film.

9. The semiconductor memory device according to claim 1, further comprising:
    an interlevel insulator formed around the ferroelectric capacitor; and
    a third hydrogen barrier insulating film formed above the interlevel insulator.

10. The semiconductor memory device according to claim 9, wherein the ferroelectric capacitor is formed on a lower hydrogen barrier insulating film.

11. The semiconductor memory device according to claim 1, wherein the ferroelectric capacitor is formed on a lower hydrogen barrier insulating film.

12. The semiconductor memory device according to claim 2, wherein the third barrier insulating film is an aluminum oxide film.

* * * * *